(12) United States Patent
Thomas et al.

(10) Patent No.: US 7,785,487 B2
(45) Date of Patent: Aug. 31, 2010

(54) POLYMERIC BARRIER REMOVAL POLISHING SLURRY

(75) Inventors: Terence M. Thomas, Newark, DE (US); Qianqiu Ye, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 11/504,508

(22) Filed: Aug. 15, 2006

(65) Prior Publication Data

US 2007/0051917 A1    Mar. 8, 2007

Related U.S. Application Data

(60) Provisional application No. 60/715,918, filed on Sep. 8, 2005.

(51) Int. Cl.
*C09K 13/00* (2006.01)

(52) U.S. Cl. ............... 252/79; 252/79.1; 252/79.2; 252/79.3; 252/79.4; 438/689; 438/690; 438/691; 438/692; 216/89

(58) Field of Classification Search ............ 252/79, 252/79.1–79.4; 438/689–692; 216/89
See application file for complete search history.

(56) References Cited

U.S. PATENT DOCUMENTS

| | | | |
|---|---|---|---|
| 5,916,855 A * | 6/1999 | Avanzino et al. ............. 51/307 |
| 5,996,594 A | 12/1999 | Roy et al. |
| 6,158,445 A | 12/2000 | Olesen et al. |
| 6,346,741 B1 | 2/2002 | Van Buskirk et al. |
| 6,350,694 B1 | 2/2002 | Chang et al. |
| 6,524,168 B2 | 2/2003 | Luo et al. |
| 6,572,449 B2 | 6/2003 | Rhoades et al. |
| 6,607,424 B1 | 8/2003 | Costas et al. |
| 6,616,717 B2 | 9/2003 | Sachan et al. |
| 6,620,215 B2 | 9/2003 | Li et al. |
| 6,673,757 B1 | 1/2004 | Kneer |
| 6,693,035 B1 | 2/2004 | Sachan et al. |
| 6,699,299 B2 | 3/2004 | Sachan et al. |
| 6,723,691 B2 | 4/2004 | Naghshinch et al. |
| 6,786,944 B2 | 9/2004 | Hattori et al. |
| 6,916,742 B2 | 7/2005 | Ye et al. |
| 6,936,541 B2 * | 8/2005 | Bian et al. ............ 438/691 |
| 6,971,945 B2 | 12/2005 | Liu et al. |
| 7,018,560 B2 | 3/2006 | Liu et al. |
| 7,118,686 B2 * | 10/2006 | Sinha et al. ............ 252/79.1 |
| 7,323,416 B2 * | 1/2008 | Liu et al. ............ 438/692 |
| 2003/0124959 A1 | 7/2003 | Schroeder et al. |
| 2003/0219982 A1 | 11/2003 | Kurata et al. |
| 2004/0014319 A1 | 1/2004 | Sahota et al. |
| 2004/0065022 A1 | 4/2004 | Machii et al. |
| 2004/0112404 A1 | 6/2004 | Doke et al. |
| 2004/0134873 A1 | 7/2004 | Yao et al. |
| 2004/0137739 A1 | 7/2004 | Korthuis et al. |
| 2005/0001199 A1 | 1/2005 | Hattori et al. |
| 2005/0090104 A1 * | 4/2005 | Yang et al. ............ 438/689 |
| 2005/0104048 A1 | 5/2005 | Thomas et al. |
| 2005/0136671 A1 | 6/2005 | Goldberg et al. |
| 2006/0131275 A1 * | 6/2006 | Bian ............ 216/88 |

* cited by examiner

*Primary Examiner*—Lan Vinh
*Assistant Examiner*—Maki A Angadi
(74) *Attorney, Agent, or Firm*—Blake T. Biederman

(57) ABSTRACT

The aqueous slurry is useful for chemical mechanical polishing semiconductor substrates having copper interconnects. The aqueous slurry includes by weight percent, 0.01 to 25 oxidizing agent, 0.1 to 50 abrasive particles, 0.001 to 3 polyvinyl pyrrolidone, 0.01 to 10 inhibitor for decreasing static etch of the copper interconnects, 0.001 to 5 phosphorus-containing compound for increasing removal rate of the copper interconnects, 0.001 to 10 complexing agent formed during polishing and balance water; and the aqueous slurry has a pH of at least 8.

10 Claims, No Drawings

POLYMERIC BARRIER REMOVAL POLISHING SLURRY

CROSS REFERENCE TO RELATED APPLICATION

This application claims the benefit of U.S. Provisional Application Ser. No. 60/715,918 filed Sep. 8, 2005.

BACKGROUND OF THE INVENTION

As ultra-large-scale-integrated circuit (ULSI) technology migrates to smaller lines widths, there are new challenges for the integration of conventional chemical mechanical polishing (CMP) processes. In addition, the introduction of low-k and ultra-low k dielectric films requires the use of a gentler CMP processes due to the films' low mechanical strength and weak adhesion to adjacent layers. Furthermore, ever-tightening defectivity specifications have placed additional demands on polishing slurries for low k films.

The integration of various low k films into USLIs can also require numerous extra steps and the incorporation of new technologies such as supercritical cleaning, dielectric and metal caps, conformal deposition of barriers and copper, chemical mechanical planarization with low down force and abrasive-free slurries. In addition to these technical options, ULSI fabricators must consider and address process complexity versus yield, reliability, mechanical strength, and performance, namely power dissipation from resistance-capacitance (RC) delay.

The complexities surrounding implementation of low k materials have introduced larger challenges for the barrier CMP process, which will necessitate the ability to control the complicated input variables and achieve a consistent high yield. Tuning process variables can contribute to decreasing polishing variation on the low k film. But the most desirable barrier CMP slurry will incorporate a low k dielectric-specific, surface activated agent that has process tunable performance adjustability. For example, Ye et al. in U.S. Pat. No. 6,916,742 disclose a slurry that adjusts the amount of polyvinyl pyrrolidone to control tantalum nitride and carbon doped oxide (CDO) removal rates. Adjusting the amounts of polyvinyl pyrrolidone and silica controls the ratio of tantalum nitride (barrier) to CDO (ultra low k dielectric) removal rates achieved with the slurry. Unfortunately, these slurries have inadequate copper removal rate for some applications.

There is a demand for a polishing slurry that can achieve the modular removal of barriers to ultra low k dielectrics with increased copper removal rates. Furthermore, there is a demand for a slurry that can remove a barrier with controlled dielectric erosion and controlled copper dishing.

STATEMENT OF THE INVENTION

In one aspect of the invention, the invention includes an aqueous slurry useful for chemical mechanical polishing a semiconductor substrate having copper interconnects comprising by weight percent, 0.01 to 25 oxidizing agent, 0.1 to 50 abrasive particles, 0.001 to 3 polyvinyl pyrrolidone, 0.01 to 10 inhibitor for decreasing static etch of the copper interconnects, 0.001 to 5 phosphorus-containing compound for increasing removal rate of the copper interconnects, 0.001 to 10 complexing agent formed during polishing and balance water; and the aqueous slurry having a pH of at least 8.

In another aspect of the invention, the invention includes an aqueous slurry useful for chemical mechanical polishing a semiconductor substrate having copper interconnects comprising by weight percent, 0.05 to 15 oxidizing agent, 0.1 to 40 silica abrasive particles, 0.002 to 2 polyvinyl pyrrolidone, 0.02 to 5 azole inhibitor for decreasing static etch of the copper interconnects, 0.01 to 3 phosphorus-containing compound for increasing removal rate of the copper interconnects, 0.01 to 5 organic acid complexing agent formed during polishing and balance water; and the aqueous slurry having a pH of 8 to 12.

In another aspect of the invention, the invention includes an aqueous slurry useful for chemical mechanical polishing a semiconductor substrate having copper interconnects comprising by weight percent, 0.1 to 10 oxidizing agent, 0.25 to 35 silica abrasive particles, 0.01 to 1.5 polyvinyl pyrrolidone, 0.05 to 2 benzotriazole inhibitor for decreasing static etch of the copper interconnects, 0.02 to 2 phosphorus-containing compound for increasing removal rate of the copper interconnects, 0.01 to 5 organic acid complexing agent formed during polishing and balance water; and the aqueous slurry having a pH of 9 to 11.5.

DETAILED DESCRIPTION

It has been discovered that adding phosphate-containing compounds to a polyvinyl pyrrolidone-containing slurry can increase copper removal rate without an adverse impact upon the barrier, low k and ultra low k removal rates of semiconductor substrates. For purposes of this specification, semiconductor substrates include wafers having metal conductor interconnects and dielectric materials separated by insulator layers in a manner that can produce specific electrical signals. Furthermore, these slurries unexpectedly improve the wafer's surface roughness. Finally, these slurries provide a stable film after the CMP process that facilitates cleaning with aggressive cleaners without an adverse impact on the wafer's surface roughness.

The slurry also contains 0.001 to 3 weight percent polyvinyl pyrrolidone for removal of barrier with selective removal rates of low-k dielectric films. This specification expresses all concentrations in weight percent, unless specifically noted otherwise. Preferably, the slurry contains 0.002 to 2 weight percent polyvinyl pyrrolidone. Most preferably, the slurry contains 0.01 to 1.5 weight percent polyvinyl pyrrolidone. For applications demanding barrier removal with a modest low-k removal rate, the slurry preferably contains less than 0.4 weight percent polyvinyl pyrrolidone. For applications demanding barrier removal with a low low-k removal rate, the slurry preferably contains at least 0.4 weight percent polyvinyl pyrrolidone. This non-ionic polymer facilitates polishing low-k and ultra low k dielectric films (typically, hydrophobic) and hard mask capping layer films.

The polyvinyl pyrrolidone preferably has a weight average molecular weight of 1,000 to 1,000,000. For purposes of this specification, weight average molecular weight refers to molecular weight measured by gel permeation chromatography. The slurry more preferably has a molecular weight of 1,000 to 500,000 and most preferably a molecular weight of 2,500 to 50,000. For example, polyvinyl pyrrolidone having a molecular weight ranging from 12,000 to 15,000 has proven particularly effective.

The slurry contains 0.001 to 5 phosphorus-containing compound. For purposes of this specification, a "phosphorus-containing" compound is any compound containing a phosphorus atom. Preferably, the slurry contains 0.01 to 3 phosphorus-containing compound. Most preferably, the slurry contains 0.02 to 2 phosphorus-containing compound. For example, phosphorus-containing compounds include phosphates, pyrophosphates, polyphosphates, phosphonates, phosphine oxides, phosphine sulphides, phosphorinanes, phosphonates, phosphites and phosphinates including, their acids, salts, mixed acid salts, esters, partial esters, mixed esters, and mixtures thereof, such as, phosphoric acid. In particular, the polishing slurry may include specific phosphorus-containing compounds as follows: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, potassium phosphate, dipotassium phosphate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, including, their acids, salts, mixed acid salts, esters, partial esters, mixed esters, and mixtures thereof.

The preferable phosphorus-containing compounds include ammonium phosphate and phosphoric acid. Excessive ammonium phosphate, however, can introduce excessive amounts of free ammonium into solution. And excessive free ammonium can attack the copper to produce a rough metal surface. Adding phosphoric acid reacts with free alkali metals in situ, such as potassium to form potassium phosphate salt and dipotassium phosphate salt that are particularly effective.

The potassium compound also provides the benefit of forming a protective film that protects copper in aggressive post-CMP cleaning solutions. For example, the post-CMP wafer's film has sufficient integrity to protect the wafer in pH 12 solutions having aggressive copper complexing agents such as, tetramethylammonium hydroxide, ethanolamine and ascorbic acid.

Oxidizing agent in an amount of 0.01 to 25 weight percent also facilitates removal of barrier layers, such as tantalum, tantalum nitride, titanium and titanium nitride. Preferably, the slurry contains 0.05 to 15 weight percent oxidizer. Most preferably, the slurry contains 0.1 to 10 weight percent oxidizer. Suitable oxidizers include, for example, hydrogen peroxide, monopersulfates, iodates, magnesium perphthalate, peracetic acid and other peracids, persulfates, bromates, periodates, nitrates, iron salts, cerium salts, manganese (Mn) (III), Mn (IV) and Mn (VI) salts, silver salts, copper salts, chromium salts, cobalt salts, halogens, hypochlorites, or combinations comprising at least one of the foregoing oxidizers. The preferred oxidizer is hydrogen peroxide. It is to be noted that the oxidizer is typically added to the polishing composition just prior to use and in these instances the oxidizer is contained in a separate package and mixed at the place of use. This is particularly useful for unstable oxidizers, such as, hydrogen peroxide.

Adjusting the amount of oxidizer, such as peroxide, can also control the metal interconnect removal rate. For example, increasing the peroxide concentration increases the copper removal rate. Excessive increases in oxidizer, however, provide an adverse impact upon polishing rate.

The barrier metal polishing composition includes an abrasive for "mechanical" removal of the barrier material. The abrasive is preferably a colloidal abrasive. Example abrasives include the following: inorganic oxide, metal boride, metal carbide, metal hydroxide, metal nitride, or a combination comprising at least one of the foregoing abrasives. Suitable inorganic oxides include, for example, silica ($SiO_2$), alumina ($Al_2O_3$), zirconia ($ZrO_2$), ceria ($CeO_2$), manganese oxide ($MnO_2$), and mixtures thereof. Alumina is available in many forms such as alpha-alumina, gamma-alumina, delta-alumina, and amorphous (non-crystalline) alumina. Other suitable examples of alumina are boehmite (AlO(OH)) particles and mixtures thereof. Modified forms of these inorganic oxides such as polymer-coated inorganic oxide particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, and mixtures comprising at least one of the foregoing metal carbides, boride and nitrides. Diamond may also be utilized as an abrasive if desired. Alternative abrasives also include polymeric particles and coated polymeric particles. The preferred abrasive is silica.

The abrasive has a concentration in the aqueous phase of the polishing composition of 0.1 to 50 weight percent. For abrasive-free solutions, a fixed abrasive pad assists with the removal of the barrier layer. Preferably, the abrasive concentration is 0.1 to 40 weight percent. And most preferably, the abrasive concentration is 0.25 to 35 weight percent. Typically, increasing abrasive concentration increases the removal rate of dielectric materials; and it especially increases the removal rate of low-k dielectric materials, such as carbon-doped oxide. For example, if a semiconductor manufacturer desires an increased low-k dielectric removal rate, then increasing the abrasive content can increase the dielectric removal rate to the desired level.

The abrasive preferably has an average particle size of less than 250 nm for preventing excessive metal dishing and dielectric erosion. For purposes of this specification, particle size refers to the colloidal silica's average particle size. Most preferably, the silica has an average particle size of less than 150 nm to further reduce metal dishing and dielectric erosion. In particular, an average abrasive particle size less than 75 nm removes the barrier metal at an acceptable rate without excessive removal of the dielectric material. For example, the least dielectric erosion and metal dishing occur with a colloidal silica having an average particle size is 20 to 75 nm. Decreasing the size of the colloidal silica tends to improve the selectivity of the solution; but it also tends to decrease the barrier removal rate. In addition, the preferred colloidal silica may include additives, such as dispersants to improve the stability of the silica at acidic pH ranges. One such abrasive is colloidal silica that is available from AZ Electronic Materials France S.A.S., of Puteaux, France.

In addition to the inhibitor, 0.001 to 10 weight percent complexing agent prevents precipitation of nonferrous metals. Most preferably, the slurry contains 0.01 to 5 weight percent complexing agent. Preferably, the complexing agent is an organic acid. Example complexing agents include the following: acetic acid, citric acid, ethyl acetoacetate, glycolic acid, lactic acid, malic acid, oxalic acid, saliclylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, and salts thereof. Preferably, the complexing agent is selected from the group consisting of acetic acid, citric acid, ethyl acetoacetate, glycolic acid, lactic acid, malic acid, oxalic acid. Most preferably, the complexing agent is citric acid.

An addition of 0.01 to 10 total weight percent inhibitor decreases removal rate of copper interconnects and protects the copper from static etch. For purposes of this application, copper interconnect refers to interconnects formed with copper having incidental impurities or copper-base alloys. Adjusting the concentration of an inhibitor adjusts the copper interconnect removal rate by protecting the metal from static etch. Preferably the slurry contains 0.02 to 5 inhibitor. Most preferably, the solution contains 0.05 to 2 weight percent inhibitor. The inhibitor may consist of a mixture of inhibitors. Azole inhibitors are particularly effective for copper interconnects. Typical azole inhibitors include benzotriazole (BTA), mercaptobenzothiazole (MBT), tolytriazole and imidazole. BTA is a particularly effective inhibitor for copper interconnects and imidazole can increase copper removal rate.

tured by Rohm and Haas Company, (Kathon and Kordek are trademarks of Rohm and Haas Company).

Preferably, the slurry polishes a semiconductor substrate by applying the slurry to a semiconductor substrate by placing 21 kPa or less downward force on a polishing pad. The downward force represents the force of the polishing pad against the semiconductor substrate. The polishing pad may have a circular shape, a belt shape or a web configuration. This low downward force is particularly useful for planarizing the semiconductor substrate to remove a barrier material from the semiconductor substrate. Most preferably, the polishing occurs with a downward force of less than 15 kPa.

EXAMPLES

A series of three comparative slurries (A to C) and three examples (1 to 3) mixed with a balance of deionized water are shown below in Table 1.

TABLE 1

| Slurry | NH$_4$Cl (wt %) | CA (wt %) | PVP (wt %) | Imidazole (wt %) | BTA (wt %) | Biocide (wt %) | H$_3$PO$_4$ (wt %) | pH | Silica (wt %) | H$_2$O$_2$ (wt %) |
|---|---|---|---|---|---|---|---|---|---|---|
| A | 0.01 | 0.3 | 0.4 | 0.8 | 0.05 | 0.005 |  | 10.50 | 14 | 0.8 |
| B | 0.01 | 0.3 | 0.4 |  | 0.03 | 0.005 |  | 9.50 | 16 | 0.4 |
| C | 0.01 | 0.3 | 0.7 |  | 0.03 | 0.005 |  | 9.50 | 18 | 0.4 |
| 1 | 0.01 | 0.3 | 0.4 |  | 0.02 | 0.005 | 0.1 | 10.50 | 14 | 0.4 |
| 2 | 0.01 | 0.3 | 0.4 |  | 0.05 | 0.005 | 0.1 | 10.50 | 14 | 0.8 |
| 3 | 0.01 | 0.3 | 0.4 |  | 0.05 | 0.005 | 0.2 | 10.50 | 14 | 0.8 |

CA = citric acid,
PVP = polyvinyl pyrrolidone,
BTA = benzotriazole,
Biocide = Kordek ™ MLX manufactured by Rohm and Haas Company (9.5–9.9% methyl-4-isothiazolin-3-one, 89.1–89.5% water and ≦1.0% related reaction product),
Silica = 1501-50 a 50 nm silica from AZ Electronic Materials France S.A.S., of Puteaux, France.

The polishing composition has a pH of at least 8 and a balance water. Preferably, the pH is between 8 and 12 and most preferably between 9 and 11.5. In addition, the solution most preferably relies upon a balance of deionized water to limit incidental impurities. A source of hydroxy ions, such as ammonia, sodium hydroxide or potassium hydroxide adjusts the pH in the basic region. Most preferably, the source of hydroxy ions is potassium hydroxide.

Optionally, the slurry may contain leveling agents such as chlorides or in particular, ammonium chloride, buffers, dispersion agents and surfactants. For example, the slurry optionally contains 0.0001 to 0.1 weight percent ammonium chloride. Ammonium chloride provides an improvement in surface appearance and it can also facilitate copper removal by increasing the copper removal rate.

The polishing composition can also optionally include buffering agents such as various organic and inorganic bases or their salts with a pKa in the pH range of greater than 8 to 12. The polishing composition can further optionally include defoaming agents, such as non-ionic surfactants including esters, ethylene oxides, alcohols, ethoxylate, silicon compounds, fluorine compounds, ethers, glycosides and their derivatives, and the like. The defoaming agent can also be an amphoteric surfactant. The polishing composition may optionally contain biocides, such as Kordek™ MLX (9.5-9.9% methyl-4-isothiazolin-3-one, 89.1-89.5% water and ≦1.0% related reaction product) or Kathon™ ICP III containing active ingredients of 2-methyl-4-isothiazolin-3-one and 5-chloro-2-methyl-4-isothiazolin-3-one, each manufac- Example 1

Polishing tests employed 200 mm sheet wafers of Coral™ carbon doped oxide from Novellus Systems, Inc., TEOS dielectric, tantalum nitride, and electroplated copper. Topographical data arise from polishing sheet wafers with IC1010™ and embossed Politex™ polishing pads from Rohm and Haas Electronic Materials CMP Technologies.

A MIRRA™ rotary type polishing platform polished the sheet wafers. First step copper polishing used Eternal slurry EPL2360 with an IC1010™ polishing pad on platens 1 and 2 using a Kinik AD3CG-181060 grid diamond conditioning disk. The polishing conditions for platens 1 were platen speed 93 rpm, carrier speed 21 rpm and downforce of 4 psi (27.6 kPa) and platen 2 platen Speed of 33 rpm, carrier speed 61 rpm and downforce of 3 psi (20.7 kPa). The polishing conditions for platen 3 were 1.5 psi (10.3 kPa) downforce, 93 rpm platen speed, 87 rpm carrier speed with a slurry flow rate of 200 ml/min. using Hi embossed Politex™ polishing pads.

Removal rates were calculated from the before and after polish film thickness. All optically transparent films were measured using a Tencor SM300 ellipsometric measuring device configured at $170 \times 10^{-6} \Omega$ for copper and $28,000 \times 10^{-6} \Omega$ for tantalum nitride. Wafer topography data was collected using a Dektak Veeco V200SL stylus profilometer. All the reported removal rates are in units of Å/min.

TABLE 2

| Slurry | Silica (wt %) | pH | $H_2O_2$ (wt %) | Avg. TEOS (Å/min.) | Cu (Å/min.) | TaN (Å/min.) | CDO (Å/min.) |
|---|---|---|---|---|---|---|---|
| A | 14 | 10.5 | 0.8 | 701 | 356 | 591 | 361 |
| B | 16 | 9.5 | 0.4 | 626 | 281 | 451 | 350 |
| C | 18 | 9.5 | 0.4 | 637 | 321 | 462 | 312 |
| 1 | 14 | 10.5 | 0.4 | 840 | 380 | 760 | 450 |
| 2 | 14 | 10.5 | 0.8 | 804 | 329 | 705 | 382 |
| 3 | 14 | 10.5 | 0.8 | 842 | 447 | 769 | 419 |

Table 2 illustrates that imidazole and phosphoric acid promotes copper removal rate with some increase in TEOS. At the pH levels tested, however, phosphoric acid combines with potassium to form potassium phosphate and dipotassium phosphate. Comparing slurry B in Table 2 to slurry C; all removal rates increase due to higher abrasive content except the CDO removal rate due to the increased polyvinyl pyrrolidone in slurry C. Comparing slurry B (no copper accelerant) to slurry A (imidazole accelerant) and to slurries 1, 2 and 3 in Table 2 (phosphate accelerant); shows that the copper removal rate increases due to these accelerants.

Table 3 below contains AFM surface roughness measurements after cleaning with ESC 784 supplied by ATMI.

TABLE 3

| Slurry | P · V · (nm) | RMS (nm) | RA (nm) |
|---|---|---|---|
| A | 23.15 | 0.459 | 0.215 |
| B | 3.32 | 0.312 | 0.243 |
| C | 3.16 | 0.226 | 0.175 |
| 1 | 8.80 | 0.311 | 0.229 |
| 2 | 3.49 | 0.245 | 0.188 |
| 3 | 4.14 | 0.246 | 0.190 |

The data of Table 3 illustrate that potassium compounds polished sheet wafers with improved surface roughness in relation to slurries containing imidazole. Comparing RMS surface roughness of slurry B (no accelerant) in Table 3 to slurry A (imidazole accelerant); Formulation A can be used to produce a rougher surface following post-CMP cleaning (in this case cleaned with ESC 784 supplied by ATMI). Comparing slurry B (no accelerant) to slurries 1, 2 and 3 (phosphate accelerant); shows that the surface roughness following post-CMP cleaning can be lowered via slurries using this accelerant.

We claim:

1. An aqueous slurry useful for chemical mechanical polishing to remove a barrier material from a semiconductor substrate having copper interconnects comprising by weight percent, 0.01 to 25 oxidizing agent, 0.1 to 50 abrasive particles, 0.002 to 3 polyvinyl pyrrolidone, 0.01 to 10 inhibitor for decreasing static etch of the copper interconnects, 0.001 to 5 phosphate compound selected from at least one of ammonium phosphate, potassium phosphate and dipotassium phosphate for increasing removal rate of the copper interconnects, 0.0001 to 0.1 ammonium chloride for increasing removal rate of the copper interconnects, 0.001 to 10 copper complexing agent, the copper complexing agent forming with copper during polishing, and balance water; and the aqueous slurry having a pH of at least 8.

2. The aqueous slurry of claim 1 wherein the polyvinyl pyrrolidone has a weight average molecular weight of 1,000 to 1,000,000.

3. The aqueous slurry of claim 1 wherein the slurry includes silica abrasive particles.

4. An aqueous slurry useful for chemical mechanical polishing to remove a barrier material from a semiconductor substrate having copper interconnects comprising by weight percent, 0.05 to 15 oxidizing agent, 0.1 to 40 silica abrasive particles, 0.002 to 2 polyvinyl pyrrolidone, 0.01 to 5 azole inhibitor for decreasing static etch of the copper interconnects, 0.01 to 3 phosphate compound selected from at least one of ammonium phosphate, potassium phosphate and dipotassium phosphate for increasing removal rate of the copper interconnects, 0.0001 to 0.1 ammonium chloride for increasing removal rate of the copper interconnects, 0.01 to 5 organic acid copper complexing agent, the copper complexing agent forming with copper during polishing, and balance water; and the aqueous slurry having a pH of 8 to 12.

5. The aqueous slurry of claim 4 wherein the polyvinyl pyrrolidone has a weight average molecular weight of 1,000 to 500,000.

6. The aqueous slurry of claim 4 wherein the slurry includes silica abrasive particles having an average particle size of less than 100 nm.

7. The aqueous slurry of claim 4 wherein the phosphate compound is dipotassium phosphate.

8. An aqueous slurry useful for chemical mechanical polishing to remove a barrier material from a semiconductor substrate having copper interconnects comprising by weight percent, 0.1 to 10 oxidizing agent, 0.25 to 35 silica abrasive particles, 0.01 to 1.5 polyvinyl pyrrolidone, 0.01 to 2 benzotriazole inhibitor for decreasing static etch of the copper interconnects, 0.02 to 2 phosphate compound selected from at least one of ammonium phosphate, potassium phosphate and dipotassium phosphate for increasing removal rate of the copper interconnects, 0.0001 to 0.1 ammonium chloride for increasing removal rate of the copper interconnects, 0.01 to 5 organic acid copper complexing agent, the copper complexing agent forming with copper during polishing, and balance water; and the aqueous slurry having a pH of 9 to 11.5.

9. The aqueous slurry of claim 8 wherein the complexing agent is citric acid.

10. The aqueous slurry of claim 8 wherein the phosphate compound is dipotassium phosphate.

* * * * *